United States Patent
Huang

[11] Patent Number: 5,834,811
[45] Date of Patent: Nov. 10, 1998

[54] SALICIDE PROCESS FOR FETS

[75] Inventor: Jenn-Ming Huang, Hsin-Chu, Taiwan

[73] Assignee: Taiwan Semiconductor Manufacturing Company, Ltd., Hsin-Chu, Taiwan

[21] Appl. No.: 967,915

[22] Filed: Nov. 12, 1997

Related U.S. Application Data

[60] Continuation of Ser. No. 665,331, Jun. 17, 1996, abandoned, which is a division of Ser. No. 497,765, Jul. 3, 1996, Pat. No. 5,554,549.

[51] Int. Cl.$^6$ ................................................ H01L 27/01
[52] U.S. Cl. ..................... 257/336; 257/344; 257/388; 257/408; 257/900; 257/213
[58] Field of Search ..................... 257/336, 344, 257/408, 900, 213, 388, 407, 412, 413

[56] References Cited

U.S. PATENT DOCUMENTS

| | | |
|---|---|---|
| 5,053,349 | 10/1991 | Matsuoka .................................. 437/41 |
| 5,162,349 | 11/1992 | Beriger et al. ......................... 514/363 |
| 5,278,098 | 1/1994 | Wei et al. .............................. 437/192 |

*Primary Examiner*—Carl W. Whitehead
*Attorney, Agent, or Firm*—George O. Saile; Stephen B. Ackerman

[57] ABSTRACT

In this structure, the lightly doped layers that form the upper portions of the source and drain regions extend inwards towards the gate region, thereby satisfying the design requirements of low area and high resistivity at the interface, but not outwards towards the poly/silicide conductors that make connection to the source and drain areas.

5 Claims, 3 Drawing Sheets

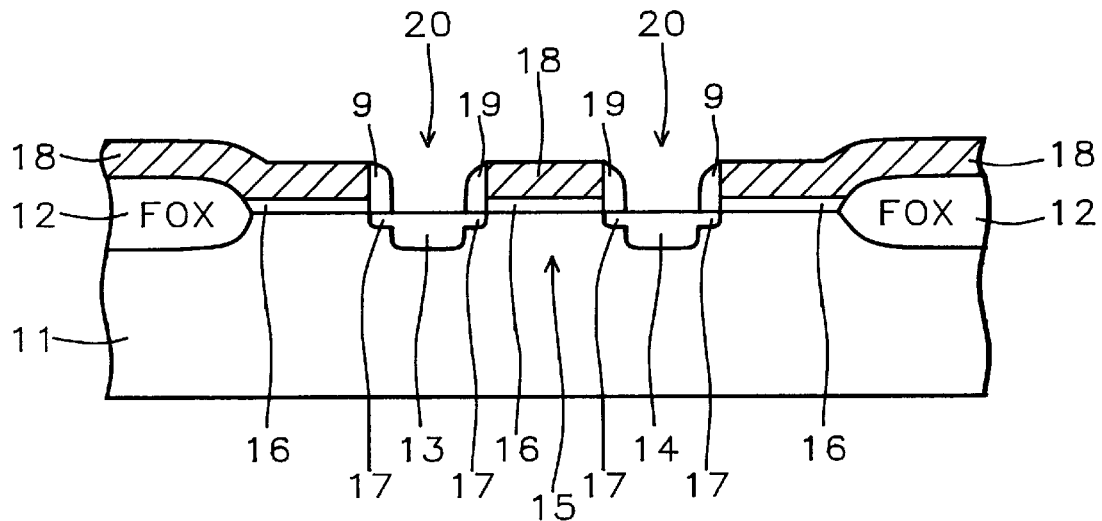
FIG. 1 – Prior Art
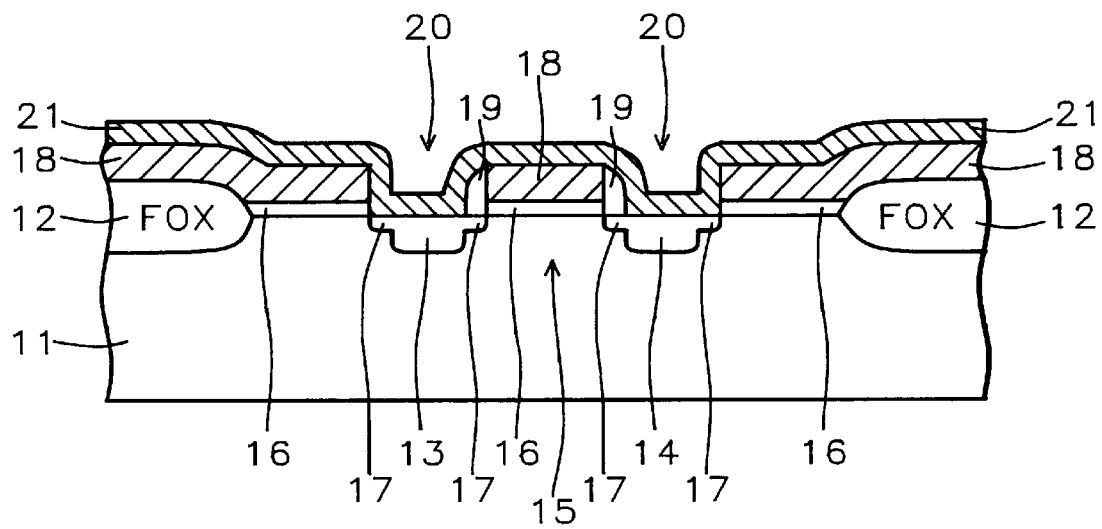
FIG. 2 – Prior Art

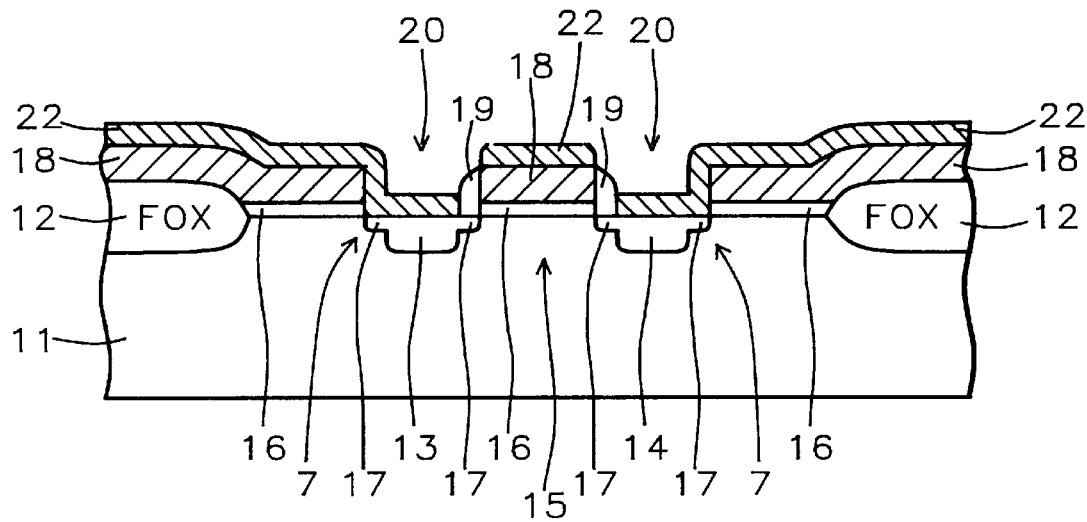
FIG. 3 – Prior Art
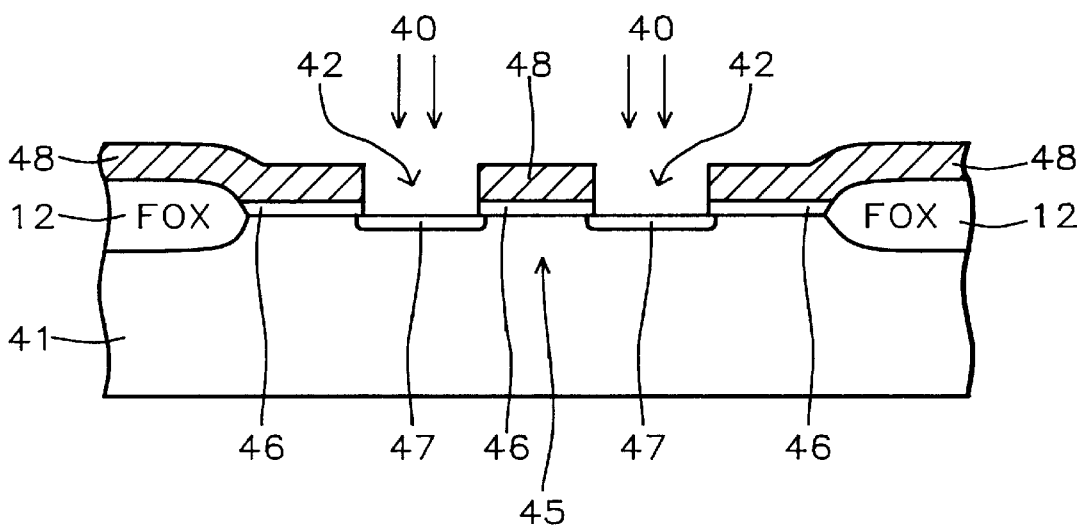
FIG. 4

SALICIDE PROCESS FOR FETS

This is a continuation of application Ser. No. 08/665,321 filed Jun. 17, 1996 now abandoned which is a divisional patent application of Ser. No. 08/497,765 which was filed on Jul. 3, 1996 and was issued as U.S. Pat. No. 5,554,549 on Sep. 10, 1996.

BACKGROUND OF THE INVENTION (1) Field of the Invention

The invention relates to the general field of semiconductor integrated circuits, more particularly to the salicide process.

(2) Description of the Prior Art

Field Effect Transistors (FETs), in their simplest form, comprise a body of semiconducting material, usually silicon, having two regions of opposite conductivity type to its own, embedded within it and spaced a short distance apart. Said regions of opposite conductivity type are referred to as source and drain regions, the region between them being referred to as the gate region. In most FET designs the surface of the silicon in the gate region is covered with a thin layer of silicon oxide. Electrically separate electrodes contact all three regions.

Normally, when voltage is applied between source and drain, very little current flows since one of the two PN junctions (relative to the silicon body) will always be back biased. When, however, voltage of the right polarity is applied to the gate the concentration of minority carriers in a thin layer immediately beneath the gate oxide can be increased to a level sufficient for it to assume the same conductivity type as the source and drain regions, thereby allowing current to flow between them.

FETs operate most efficiently if the area of the interface between source/drain and gate region is kept as small as possible and, additionally, if the resistivity of the source/drain regions at said interface is as high as possible. However, this requirement conflicts with the requirement that any series resistance introduced into the basic FET circuit by the source and drain must be kept as low as possible.

These two conflicting sets of requirements have been largely reconciled in the Lightly Doped Drain (LDD) design which is illustrated in FIG. 1 as a schematic cross-section. Source and drain regions 13 and 14, respectively, are embedded within silicon body 11, separated from one another by gate region 15. For an NPN FET design, body 11 will be P type while regions 13 and 14 are of type N+, i.e. low resistivity, satisfying the requirement that they introduce minimum series resistance into the circuit. To satisfy the requirement of high resistivity and small area at the interface with region 15, shallow layers 17 of type N−, i.e. high resistivity, extend outward a short distance from regions 13 and 14 to form the source/drain interface with gate region 15.

Since FIG. 1 is not drawn to scale, it does not bring out the fact that the dimensions of the various regions are very small. Furthermore, it is essential that regions 13, 14, and 17 all be very precisely located relative to one another. Also, regions 13 and 14 as well as the top surface of oxide layer 16 must all be fully covered by suitable electrical contacts that do not accidentally connect (short circuit) to one another.

These latter requirements are met by use of the Self Aligned Silicide (Salicide) process. Initially a body of silicon is provided that includes field isolation regions of thick oxide, such as 12 in FIG. 1. The entire body is then coated with a thin layer of oxide (such as 16) followed by a layer of polycrystalline silicon (poly) such as 18 in FIG. 1. Trenches 20 are then etched in layers 18 and 16 down to the level of the silicon body, leaving a pedestal of material above gate region 15. The entire structure is now subjected to an ion implantation process to produce a shallow, lightly doped layer at the bottom of trenches 20.

A layer of silicon oxide is then formed on the vertical side walls of trenches 20 to form spacers 9 and 19 and the structure is subjected to a second ion implantation process, to form the relatively deep, heavily doped, layers 13 and 14. Region 17 is now all that is left of the previously formed lightly doped layer. The structure of FIG. 1 has now been achieved.

To complete the process of making full, but non touching, contacts to the source, drain, and gate regions, spacers 9, i.e. the spacers that cover the walls of trenches 20 on the far side from gate region 15, are selectively removed, leaving spacers 19 in place. Then, a layer of a refractory metal is deposited over the entire structure, giving it the appearance illustrated in FIG. 2, where said refractory metal is represented by layer 21. The structure shown in FIG. 2 is now subjected to a heat treatment of sufficient intensity to cause layer 21 to react with underlying poly layer 18 and be fully converted to a silicide.

Finally, a selective etch treatment is used to remove any unreacted (non-silicided) refractory metal from the structure, in particular those portions of layer 21 that were in contact with spacers 19, rather than poly layer 18. The salicide process is now complete and the structure has the appearance illustrated in FIG. 3 where the layer of metal silicide is designated as 22. Source and drain regions 13 and 14, as well as the gate region 15, are now fully contacted without said contacts touching one another.

A serious limitation is associated with the above described process. Referring once again to FIG. 3, it can be seen that silicide layer 22 overlies that part of the the shallow, lightly doped, source/drain region that extends in a direction away from gate region 15 (designated here as 7 to distinguish it from the portion 17 that extends to the edge of the gate region. Because said layer is so very thin, there exists a finite probability that layer 22 may, on occasion, penetrate it and be short circuited to the main body 11.

A number of issued patents describe various apsects of and refinements to the salicide process but none, of which we are aware, addresses the above discussed problem of potential shorting through the lightly doped shallow layer. For example, Matsuoka (U.S. Pat. No. 5,053,349 Oct. 1, 1991) teaches several ways to use a refractory metal layer to connect a poly layer to the source, drain, and gate regions. With tungsten this is achieved by means of a deposition technique that causes metal to be selectively deposited on poly but not on oxide (spacers). With titanium a similar result is achieved by forming the silicide and then selectively etching. In this invention, the FET design is not of the LDD type and source/drain regions are formed through diffusion rather than ion implantation.

Koler et al. (U.S. Pat. No. 5,162,259 Nov. 10, 1992) teach a method for forming a buried contact by using a layer of heavily doped poly as a diffusion source. Dopant diffuses through a metal silicide layer into the underlying silicon substrate, thereby forming a buried contact. The preferred metal for siliciding is cobalt.

Wei et al. (U.S. Pat. No. 5,278,098 Jan. 11, 1994) teaches a fairly specific method for making contact between two coplanar layers by means of a refractory metal bridge between them, including an annealing step to form the silicide, while Wei (U.S. Pat. No. 5,346,860 Sep. 13, 1994) is similar in concept but more general.

SUMMARY OF THE INVENTION

It is an object of the present invention to devise an LDD type of FET structure that is not subject to the possibility of a short circuit between the source and/or the drain region and the main substrate, by way of the lightly doped layer.

A further object of the present invention is to develop a process for manufacturing such a structure.

Yet another object of the present invention is that said process be no more expensive than the process for manufacturing LDD types of FET as taught by the prior art.

These objects have been achieved in a structure wherein the lightly doped layers that form the upper portions of the source and drain regions extend inwards towards the gate region, thereby satisfying the design requirements of low area and high resistivity at the interface, but not outwards towards the poly/silicide conductors that make connection to the source and drain areas. The process for manufacturing this structure is similar to that of the prior art with the important difference that the oxide spacers on the outside walls (away from the gate region) of the source/drain trenches are removed prior to the formation of the heavily doped portions of the source/drain, not after it.

BRIEF DESCRIPTION OF THE DRAWINGS

FIGS. 1 through 3 show various stages in the manufacture of an LDD FET structure by the salicide process, using a method based on the prior art.

FIGS. 4 through 6 show various stages in the manufacture of an LDD FET structure by the salicide process, using a method based on the present invention.

DESCRIPTION OF THE PREFERRED EMBODIMENTS

Figure 5:
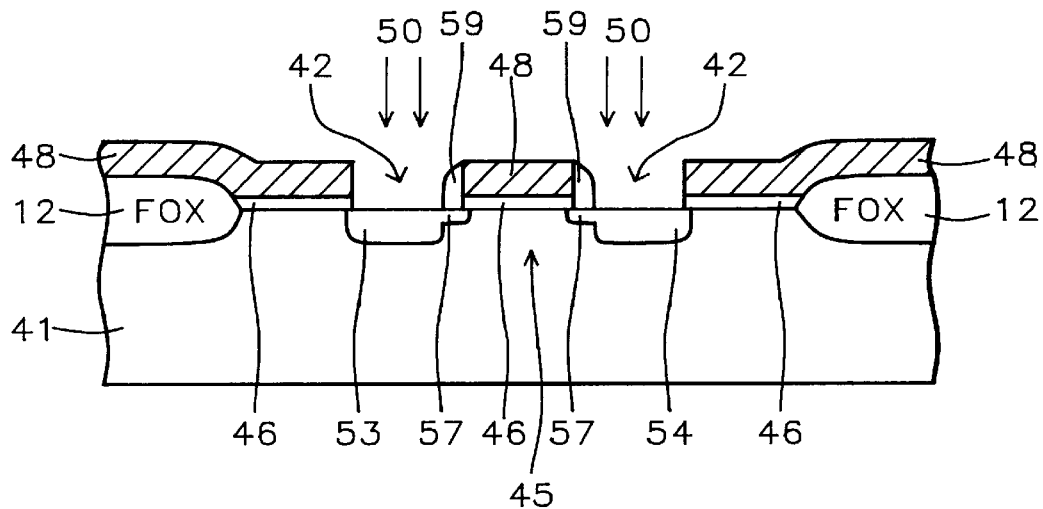

The process that forms the principal subject of the present invention is aimed at the formation of FETS of the LDD type of design. The embodiment which we will describe below is for an NPN version but it will be understood by those skilled in the art that a PNP structure could just as well have been used as a vehicle for illustration.

Referring now to FIG. 4, the process begins with the provision of a P type body of silicon 41, including field isolation regions 12 of thick oxide. A thin layer of gate oxide 46, overcoated with layer 48 of poly, covers the entire structure. The thickness of gate oxide layer 46 may be anywhere from about 50 to 500 Angstrom units while that of poly layer 48 may be between about 1,000 and 5,000 Angstrom units. Twin trenches 42 have been etched through layer 48 down to the level of gate oxide 46, said trenches being separated one from another by gate region 45.

The entire structure is now subjected to an ion implantation process (indicated by the arrows 40 in FIG. 4) to produce a shallow, lightly doped N type layer (layer 47) at the bottom of trenches 42. The voltage used to accelerate the ions is in the range of from about 25 to 80 kV, resulting in a layer thickness between about 800 and 4,000 Angstrom units. The dosage is in the range of from about $10^{13}$ to $10^{14}$ atoms/sq. cm.

Referring now to FIG. 5, the vertical walls of trenches 42 are formed and then the oxide layer that has formed on those walls of the trenches away from gate region 45 are selectively removed, resulting in the formation of spacers 59. The entire structure is now subjected to a second ion implantation process (illustrated schematically by arrows 50), using relatively high ion energies and doses (voltages from about 25 to 80 kV and doses between about $10^{15}$ and $5\times10^{15}$ atoms/sq. cm.) so that regions 53 and 54 become strongly N type (N+) and are between about 800 and 3,000 Angstrom units thick, thereby forming a source and a drain. Most of layer 47 (in FIG. 4) has been replaced by 53 or 54, all that remains being projections 57 that interface with the gate region.

To complete the process, it is necessary to make full, but non touching, connections to the source, drain, and gate regions. This is achieved by depositing a layer of a refractory metal between about 100 and 1,000 Angstrom units thick over the structure which is then subjected to a heat treatment, typically heating at a temperature between about 500° and 1,000° C. for between about 0.5 and 1.5 minutes in a nitrogen atmosphere, using Rapid Thermal Anneal type equipment. This is sufficient to cause it to react with the underlying poly (layer 48) and be fully converted to a silicide. Our preferred refractory metal has been titanium but any of several other refractory metals such as tungsten and cobalt could also be used.

Finally, a selective etch treatment is used to remove any unreacted (non-silicided) refractory metal from the structure, in particular those portions that were in contact with spacers 59, rather than poly layer 48. Selective etching (in the case of titanium) is acomplished by immersing the structure in a mixture of ammonia and hydrogen peroxide at a temperature between about 10° and 210° C. for between about 15 and 45 minutes.

Figure 6:
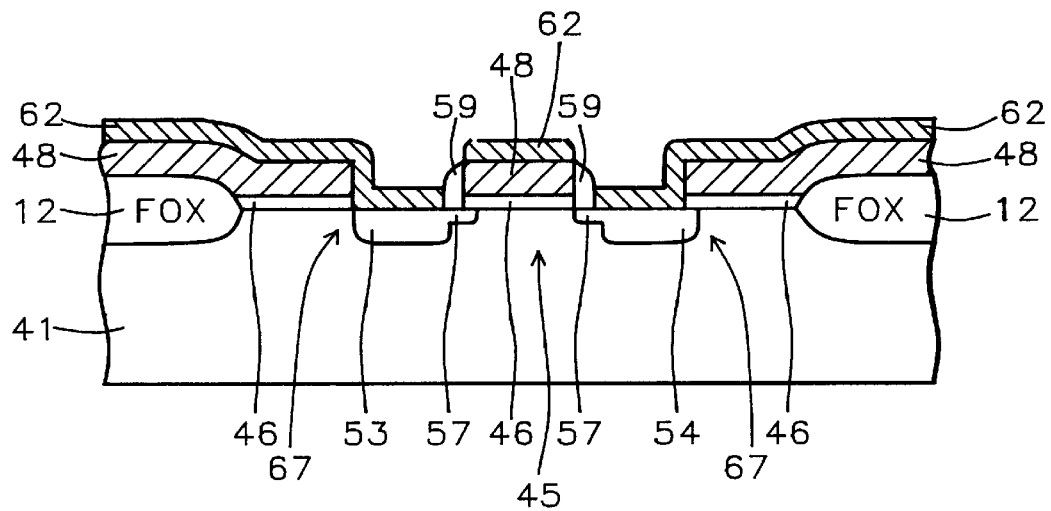

The process of the present invention is now complete and the resulting structure has the appearance illustrated in FIG. 6 where the layer of metal silicide is designated as 62. Source and drain regions 53 and 54, as well as the gate region 45, are now fully contacted and may be connected to other parts of the integrated circuit without accidentally touching one another.

Note, in FIG. 6, that, in the source and drain areas, silicide layer 62 does not overlie a thin layer of lightly doped P type material (region 57) as was the case for structures manufactured by the methods of the prior art (see for example regions 17 on the extreme left and right in FIG. 3). Thus, the possibility of layer 62 accidentally short circuiting to P type body 41 has been effectively eliminated.

While the invention has been particularly shown and described with reference to this preferred embodiment, it will be understood by those skilled in the art that various changes in form and details may be made without departing from the spirit and scope of the invention.

What is claimed is:

1. A field effect transistor structure, including connections thereto, comprising:

a body of P type silicon having a thin layer of silicon oxide on its surface, said thin layer being overcoated with a layer of polycrystalline silicon;

trenches, with floors, in said structure, down to the level of said silicon body, separated one from another by a gate region pedestal with vertical walls;

silicon oxide spacers on said vertical walls;

a shallow layer of lightly doped N type silicon located immediately below said spacers and extending downwardly into the silicon body;

a layer of heavily doped N type silicon, deeper than said shallow layer, extending downwardly from the floors of said trenches into the silicon body; and a layer of metal silicide on said layer of polycrystalline silicon and on the trench floors.

2. The structure described in claim 1 wherein the thickness of said shallow layer is between about 800 and about 4,000 Angstrom units.

3. The structure described in claim 1 wherein the concentration of N type dopant material in said shallow layer is between about $10^{13}$ and about $10^{14}$ atoms per square centimeter.

4. The structure described in claim 1 wherein the thickness of said layer of heavily doped N type silicon is between about 800 and about 3,000 Angstrom units.

5. The structure described in claim 1 wherein the concentration of N type dopant material in said layer of heavily doped N type silicon is between about $10^{15}$ and about $5 \times 10^{15}$ atoms per square centimeter.

* * * * *